United States Patent
Tanaka

(10) Patent No.: US 8,270,216 B2
(45) Date of Patent: Sep. 18, 2012

(54) SEMICONDUCTOR STORAGE DEVICE AND METHOD OF MANUFACTURING THE SAME

(75) Inventor: Masayuki Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 12/412,910

(22) Filed: Mar. 27, 2009

(65) Prior Publication Data

US 2009/0242969 A1   Oct. 1, 2009

(30) Foreign Application Priority Data

Apr. 1, 2008   (JP) ................................. 2008-094920

(51) Int. Cl.
*G11C 16/04*    (2006.01)
(52) U.S. Cl. .......... 365/185.17; 365/175.27; 365/175.28
(58) Field of Classification Search ............. 365/185.17, 365/175.27, 175.28
See application file for complete search history.

(56) References Cited

U.S. PATENT DOCUMENTS 7,539,056 B2 * 5/2009 Katsumata et al. ...... 365/185.18

FOREIGN PATENT DOCUMENTS

KR   10-2007-0041374 A   4/2007

OTHER PUBLICATIONS

Jae Sung Sim, et al., "Self Aligned Trap-Shallow Trench Isolation Scheme for the Reliability of TANOS (TaN/AlO/SiN/Oxide/Si) NAND Flash Memory", Non-Volatile Semiconductor Memory Workshop (USA), 2007 $22^{nd}$ IEEE, Aug. 26-30, 2007, pp. 110-111.
Office Action issued Nov. 25, 2010 in Korea Application No. 10-2009-27352 (With English Translation).

* cited by examiner

Primary Examiner — Howard Weiss
Assistant Examiner — Steven Rao
(74) Attorney, Agent, or Firm — Oblon, Spivak, McClelland, Maier & Neustadt, L.L.P.

(57) ABSTRACT

A semiconductor storage device including a semiconductor substrate including an upper surface having a plurality of trenches formed into the upper surface; a plurality of element isolation insulating films filled in each of the trenches so as to protrude upward from the upper surface of the semiconductor substrate, the element isolation insulating films containing an oxide material; a tunnel insulating film formed on the semiconductor substrate situated between the element isolation insulating films; a charge storing layer comprising a first nitride film and being formed on the tunnel insulating film; a block film formed across an upper surface of the charge storing layer and an upper surface of the element isolation insulating film to prevent charge transfer; a gate electrode formed on the block film; and a barrier layer containing a second nitride film formed between the element isolation insulating film and the block film.

18 Claims, 12 Drawing Sheets

SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2008-94920, filed on, Apr. 1, 2008 the entire contents of which are incorporated herein by reference.

FIELD

The present disclosure relates to a semiconductor storage device including a memory cell having a charge trap layer comprising a nitride film and a method of manufacturing the same.

BACKGROUND

Memory cells configuring a typical semiconductor memory store data corresponding to the amount of charge stored in the charge trap layer. In one exemplary implementation, the charge trap layer comprises a nitride film and electrons are stored in isolated traps. One example of such configuration is disclosed in Jae Sung Sim et al., "Self Aligned Trap-Shallow Trench Isolation Scheme for the Reliability of TANOS (TaN/AlO/SiN/Oxide/Si) NAND Flash Memory", Non-Volatile Semiconductor Memory Workshop (USA), 2007 22nd IEEE, 26-30 Aug. 2007, p 110-111. In FIG. 3 of Jae et al., a tunnel insulating film ($SiO_2$), a charge trap layer (SiN: charge storing layer), and a block film ($Al_2O_3$) are formed in listed sequence over the silicon (Si) substrate and a gate electrode comprising a tantal nitride (TaN), tungsten (W) and tungsten nitride (WN) laminated in listed sequence is formed further on top. Between the neighboring charge trap layers and at both sides of the charge trap layer, an element isolation insulating film configured as an SAT-STI (Self Aligned Trap-Shallow Trench Isolation) is formed. The block film ($Al_2O_3$) is formed across the upper surface on charge trap layer and the element isolation insulating film.

In case the block film contains organic material and the block film is thermally treated in the back end process, carbon atoms contained in the organic material is introduced into the active area through the element isolation insulating film to be stored as a fixed charge. Fixed charge within the active area causes increased variation in threshold voltage and provides grounds for reverse narrow channel effect especially at the corners of the channel areas to deteriorate device properties.

SUMMARY

According to an aspect of the disclosure, there is provided a semiconductor device including a semiconductor substrate including an upper surface having a plurality of trenches formed into the upper surface; a plurality of element isolation insulating films filled in each of the trenches so as to protrude upward from the upper surface of the semiconductor substrate, the element isolation insulating films containing oxide materials; a tunnel insulating film formed on the semiconductor substrate situated between the element isolation insulating films; a charge storing layer comprising a first nitride film and being formed on the tunnel insulating film; a block film formed across an upper surface of the charge storing layer and an upper surface of the element isolation insulating film to prevent charge transfer; a gate electrode formed on the block film; and a barrier layer containing a second nitride film formed between the element isolation insulating film and the block film.

According to an aspect of the disclosure, there is provided a method of manufacturing a semiconductor storage device including forming a tunnel insulating film on a semiconductor substrate; forming a charge storing layer comprising a first nitride film on the tunnel insulating film; forming a plurality of trenches into the charge storing layer, the tunnel insulating film, and an upper portion of the semiconductor substrate; forming an element insulating film in each of the trenches; forming a barrier film containing a second nitride film across an upper surface of the charge storing layer and an upper surface of the element isolation insulating film; forming a block film on the barrier layer to prevent charge transfer of charge stored in the charge storing layer; and forming a gate electrode on the block film.

BRIEF DESCRIPTION OF THE DRAWINGS

Other objects, features and advantages of the present disclosure will become clear upon reviewing the following description of the embodiment of the present disclosure with reference to the accompanying drawings, in which, FIG. 1 indicates an electrical configuration of one exemplary embodiment of the present disclosure.

DETAILED DESCRIPTION

One exemplary embodiment of the present disclosure will be described with reference to the drawings. References are made to the drawings hereinafter with identical or similar reference symbols when referring to identical or similar elements. Of note is that the drawings are merely schematic and the relation between the thickness and the planar dimensions and the ratios in thickness of each layer differs from the actual ratios.

Figure 1:
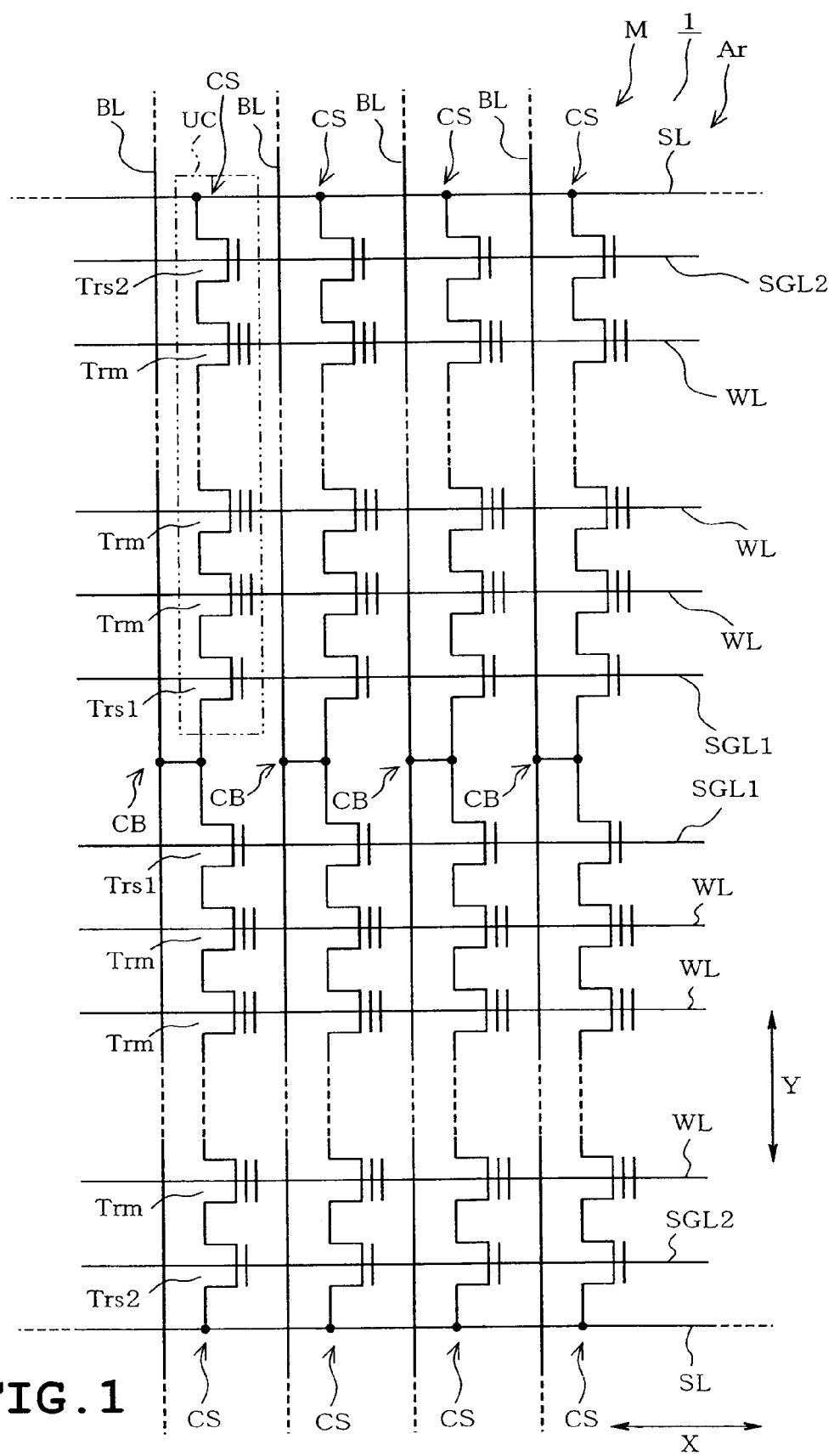
Figure 2:
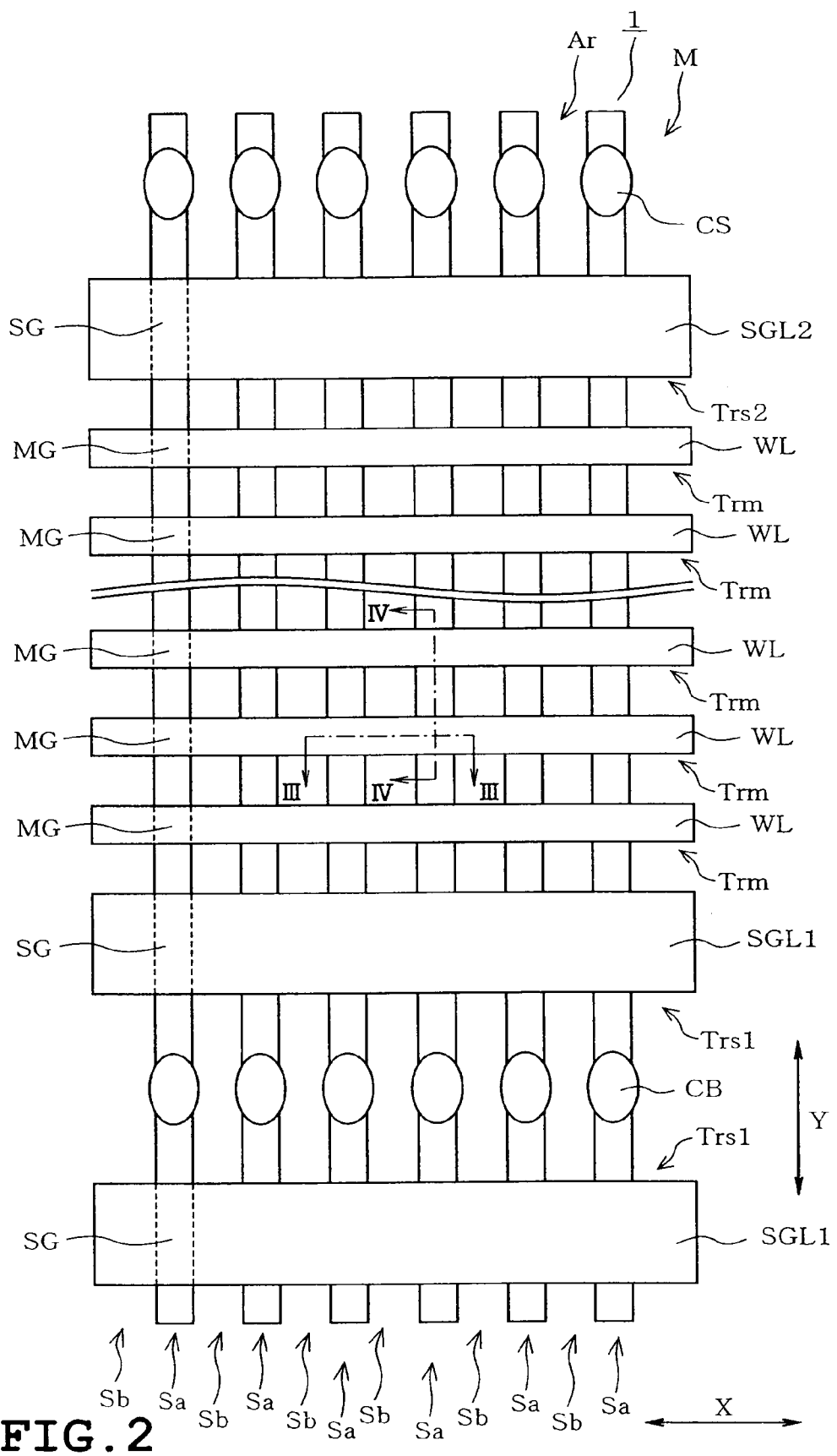
FIG. 2 is a schematic plan view partially depicting a memory cell region.

FIG. 1 partially depicts an equivalent circuit of a memory cell array within a memory cell region of a NAND flash memory. FIG. 2 is a partial schematic view of the memory cell region in plan view.

As can be seen in FIG. 1, a memory cell array Ar of NAND flash memory 1 is configured by a matrix of NAND cell units UC. NAND cell unit UC comprises two (a plurality of) select gate transistors Trs1 and Trs2, and a plurality of memory cell transistors Trm (32 for example) series connected between the two select gate transistors Trs1 and Trs2. The neighboring memory cell transistors Trm share source/drain regions within a single NAND cell unit UC.

Referring again to FIG. 1, memory cell transistors Trm aligned in an X-direction (word line direction or channel width direction) are connected to a common word line (control gate line) WL. Also, select gate transistors Trs1 aligned in the X-direction in FIG. 1 are connected to a common select gate line SGL1. Similarly, select gate transistors Trs2 aligned in the X-direction in FIG. 1 are connected to a common select gate line SGL2.

As can be seen in FIG. 1, select gate transistor Trs 1 is connected to a bit line BL extending in the Y-direction (bit line direction or channel length direction) orthogonal to the X-direction via bit line contact CB show in FIG. 2.

As shown in FIG. 2, NAND cell units UC are formed on active areas Sa which are isolated by element isolation regions Sb taking an STI (Shallow Trench Isolation) structure that extend in the Y-direction.

Memory cell transistor Trm has a gate electrode MG which is formed above the intersection of active area Sa extending in the Y-direction and word line WL extending in the X-direction and being formed at predetermined interval. Thus, gate electrodes MG, in other words, control gate electrodes CG (refer to FIG. 3) aligned in the X-direction are connected to a common word line WL.

Select gate transistor Trs1 has a gate electrode SG which is formed above the intersection of active area Sa extending in the Y-direction and select gate line SGL1 extending in the X-direction. Thus, select gate electrodes SG aligned in the X-direction are connected to a common select gate line SGL1. Select gate transistor Trs2 has a gate electrode SG which is formed above the intersection of active area Sa extending in the Y-direction and select gate line SGL2 extending in the X-direction. Thus, select gate electrodes SG aligned in the X-direction are connected to a common select gate line SGL2.

Figure 3:
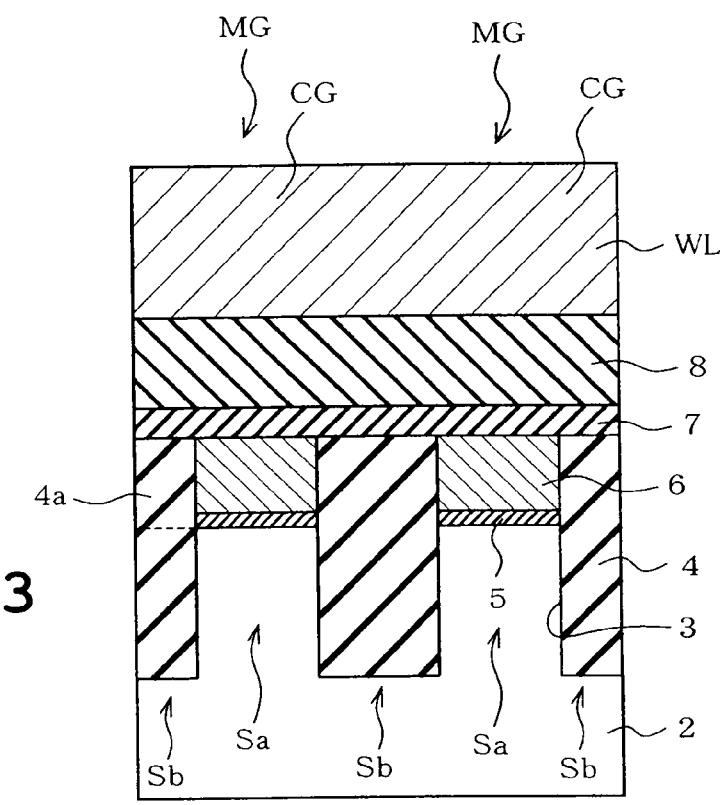
FIG. 3 is a schematic vertical cross-sectional of the memory cell region, taken along line III-III in FIG. 2.
Figure 4:
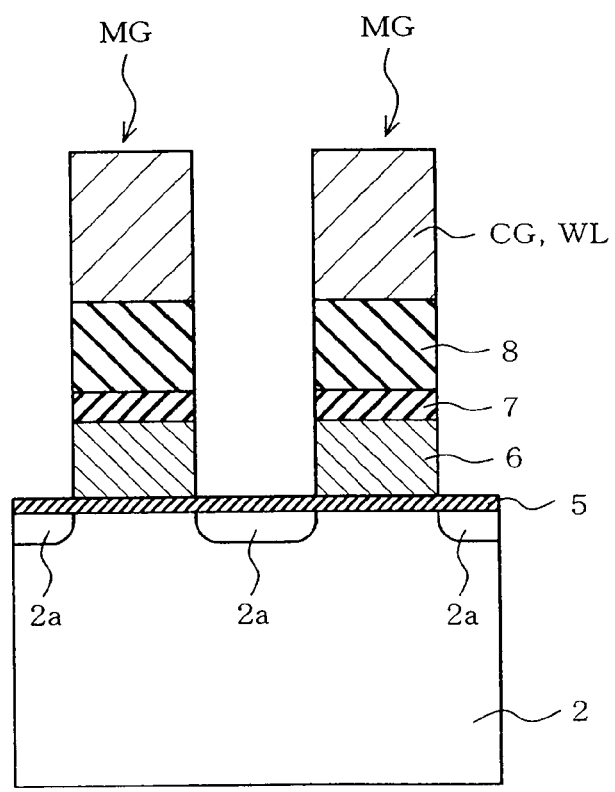
FIG. 4 is a schematic vertical cross-sectional view of the memory cell region taken along line IV-IV in FIG. 2.

FIG. 3 is a schematic cross sectional view taken along line III-III oriented in the word line direction or the channel width direction of FIG. 2. FIG. 4 is a cross sectional view taken along line IV-IV oriented in the bit line direction or the channel length direction of FIG. 2.

Referring to FIG. 3, p-type silicon substrate 2 has a well (not shown) formed in its upper portion that has a plurality of element isolation trenches 3 formed with spacing. Element isolation trenches 3 isolate active areas Sa in the X direction as viewed in FIG. 2. Element isolation trench 3 is filled with an element isolation insulating film 4 that constitutes an element isolation region Sb. Element isolation insulating film 4 comprises a lower portion filling element isolation trench 3 and an upper portion 4a protruding above the surface of silicon substrate 2.

Active areas Sa isolated by element isolation region Sb has a tunnel insulating film 5 formed on them that comprises a silicon oxide film, for example. Both side ends of tunnel insulating film 5 shown in the cross sectional view of FIG. 3 is placed in contact with a portion of the side surface of upper portion 4a of element isolation insulating film 4. On the upper surface of tunnel insulating film 5, a charge trap layer serving as a charge storing layer is formed that comprises a silicon nitride film 6. Silicon nitride film 6 is configured as an isolated charge trap layer (charge storing layer) and is placed in contact with the side surface of upper portion 4a of element isolation insulating film 4. The side surface of upper portion 4a of element isolation insulating film 4 are coplanar with the side surfaces of tunnel insulating film 5 and silicon nitride film 6.

Element isolation insulating film 4 comprises an oxide-based insulating film such as an HTO (High Temperature Oxide) film, an LTO (LowTemperature Oxide), and HDP (High Density Plasma). Upper portion 4a of element isolation insulating film 4 protrudes upward from the upper surface of silicon substrate 2 such that its upper surface is higher than the upper surface of silicon substrate 2 and higher than the upper surface of tunnel insulating film 5 but at substantially at level with the upper surface of silicon nitride film 6. The upper surface of the element isolation insulating film 4 may be configured higher or lower than the upper surface of silicon nitride film 6.

Across the upper surfaces of element isolation insulating film 4 and silicon nitride film 6, barrier layer 7 comprising a nitride film (silicon nitride film ($Si_3N_4$), for example) is formed continuously. In the present exemplary embodiment, nitride-based insulating film (silicon nitride film 6 and barrier layer 7) is formed continuously along the upper surface of tunnel insulating film 5 and along the side surface and the upper surface of the element isolation insulating film 4.

On the upper surface of barrier layer 7, a block film 8 is formed continuously over silicon nitride film 6 and element isolation insulating film 4 for preventing the penetration of electrodes (charge). Block film 8 is formed to efficiently impart voltage applied on control gates CG of gate electrodes MG onto the tunneling area. More specifically, block film 8 is provided to prevent charge transfer between silicon nitride film 6 and control gate electrode CG. For example, during data writing in which silicon nitride film 6 captures electrodes from silicon substrate 2, block film 8 prevents charge transfer from silicon nitride film 6 to control gate CG, and during data erasing, prevents charge transfer from control gate CG to silicon nitride film 6.

Block film 8 comprises a silicon oxide film or metal oxide film or both of these films in a laminated configuration having 2 or more layers. In the present exemplary embodiment, block film 8 comprises an aluminum oxide film ($Al_2O_3$) having a dielectric constant of approximately 10, for example. The single layer block film 8 may further comprise either of magnesium oxide film (MgO) having a dielectric constant of approximately 10, an yttrium oxide film ($Y_2O_3$) having a dielectric constant of approximately 16, or hafnium oxide film ($HfO_2$), zirconium oxide film ($ZrO_2$), and lanthanum oxide film ($La_2O_3$), each having a dielectric constant of approximately 22. Block film 8 may further comprise insulating film comprising ternary system compounds such as hafnium silicate film (HfSiO), and hafnium aluminate (HfAlO). Further, an oxide film including one or more of the elements silicon (Si), aluminum (Al), magnesium (Mg), yttrium (Y), hafnium (Hf), zirconium (Zr) or Lanthanum (La) may be employed.

On the upper surface of block film 8, a control gate electrode CG is formed that includes a polygate comprising a silicon layer doped with impurities such as phosphorus (P). Gate electrode MG of a memory transistor Trm thus comprises a laminated structure configured by silicon nitride film 6, barrier layer 7, block film 8, and control gate electrode CG.

As can be seen in FIG. 4, gate electrode MG of memory cell transistor Trm is aligned in the Y-direction and each gate electrode MG is electrically isolated by an isolation region. Though not shown, films such as an interlayer insulating film are formed in the isolation region. At both sides of gate electrode MG of memory cell transistor Trm, a source/drain region 2a is formed in the surface layer of silicon substrate 2.

Figure 5:
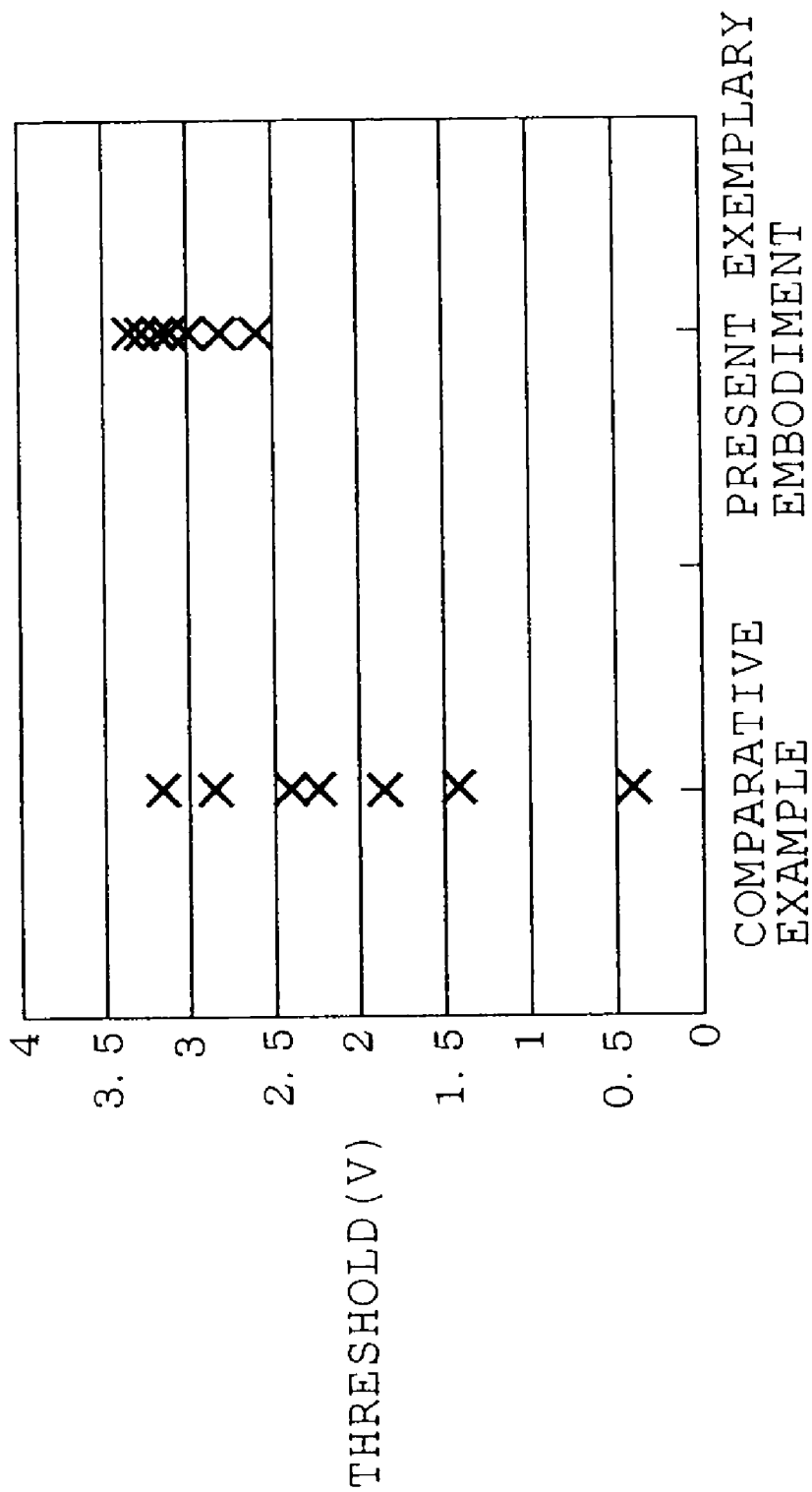
FIG. 5 is a comparative chart of threshold voltages.

FIG. 5 is a chart showing a comparison of threshold voltages of the memory transistor according to the present exemplary embodiment to a comparative example. The comparative example is configured such that block film 8 is formed directly on the upper surface of silicon nitride film 6 and the upper surface of element isolation insulating film 4 without barrier layer 7.

As can be seen in FIG. 5, the comparative example exhibits greater variance in the threshold voltage of the memory cell transistor Trm relative to the present exemplary embodiment, which is an indication that the configuration according to the present exemplary embodiment is effective in restraining variance in threshold voltage of the memory cell transistor Trm.

A method of manufacturing the above configuration will be described with reference to FIG. 6 to FIG. 13. Manufacturing method of configurations not shown will not be described. Generally employed manufacturing steps may be incorporated into or replace the under described manufacturing steps.

Figure 6:
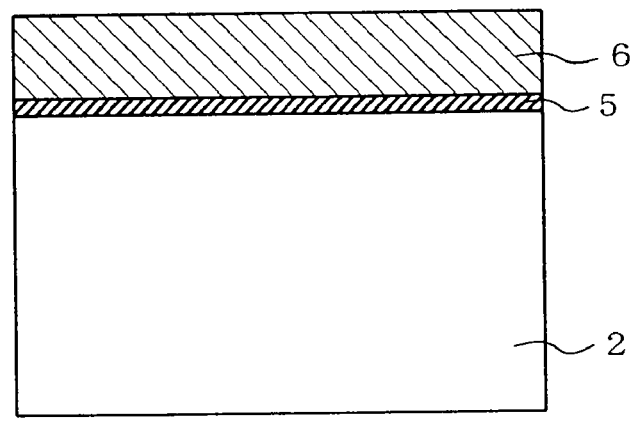
FIG. 6 to FIG. 13 each indicate a vertical cross sectional view depicting one manufacturing phase for obtaining FIG. 3.

Referring to FIG. 6, after forming an area (not shown) doped with desired impurities on silicon substrate 2, tunnel insulating film 5 is formed by thermal oxidation on the surface of silicon substrate 2. Then, silicon nitride film 6 is deposited by LP-CVD (Low Pressure Chemical Vapor Deposition) by reaction of dichlorosilane ($SiH_2Cl_2$) gas and ammonia ($NH_3$) gas at a temperature of 800 degrees Celsius or less.

Figure 7:
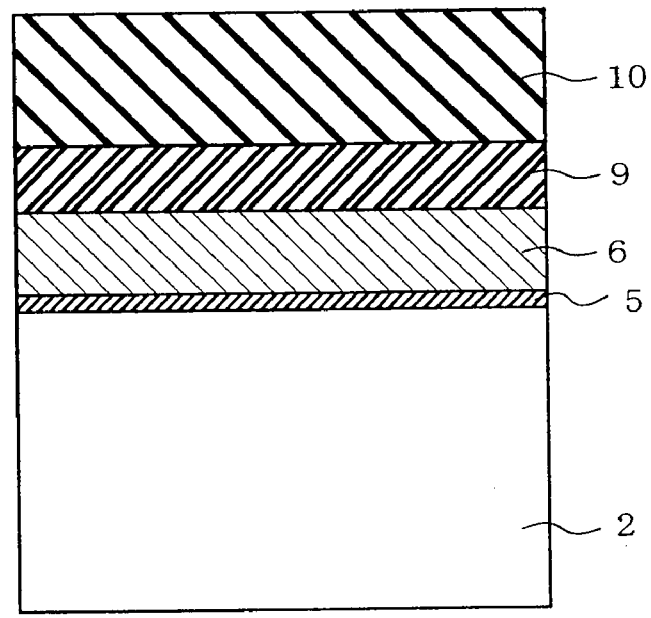
Figure 8:
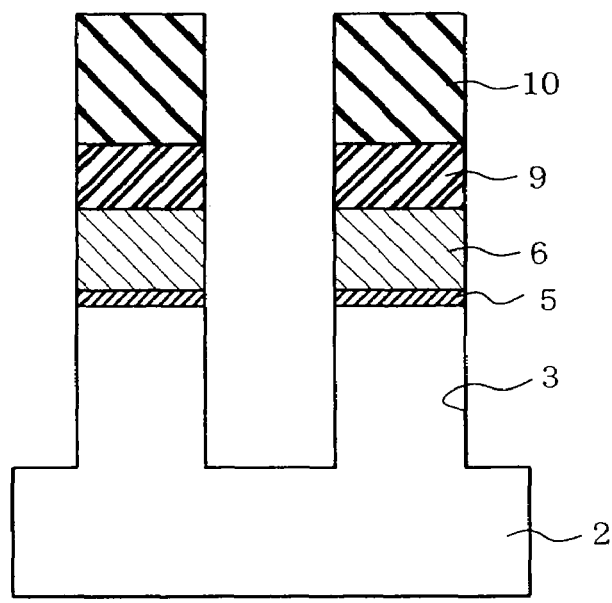

Next, as shown in FIG. 7, silicon oxide film 9 and silicon nitride film 10 serving as a mask layer are deposited in listed sequence by CVD. Silicon oxide film 9 may be replaced by polysilicon. Then, as shown in FIG. 8, trench 3 for element isolation is formed into silicon nitride film 10, silicon oxide film 9, silicon nitride film 6, tunnel insulating film 5, and the upper portion of silicon substrate 2.

Figure 9:
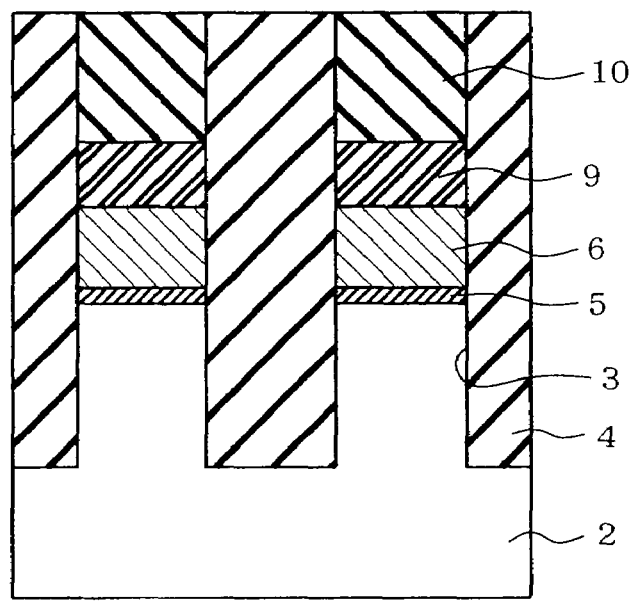

Next, as shown in FIG. 9, element isolation insulating film 4 is formed in trench 3. Element isolation insulating film 4 may comprise oxide-based insulating film including an HTO (High Temperature Oxide) film, an LTO (Low Temperature Oxide) film, and an HDP (High Density Plasma) film. Then, using silicon nitride film 10 as a stopper, element isolation insulating film 4 is planarized to be at level with silicon nitride film 10 by CMP (Chemical Mechanical Polishing).

Figure 10:
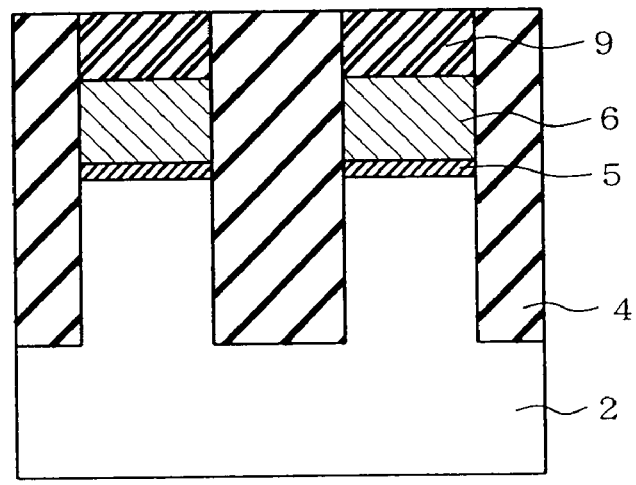

Next, as shown in FIG. 10, element isolation insulating film 4 is etched back with high selectivity to silicon nitride film 10 for height adjustment of its upper surface. The element isolation insulating film 4 is etched back so as to be substantially at level with the upper surface (substantially at level with the interface of silicon oxide film 9 and silicon nitride film 10) of silicon oxide film 9. Then, silicon nitride film 10 is removed by wet etch.

Figure 11:
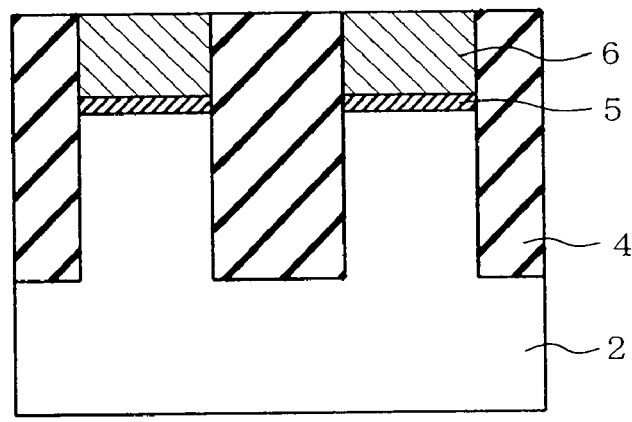

Next, as shown in FIG. 11, the upper surfaces of silicon oxide film 9 and element isolation insulating film 4 are etched back by dry etch or wet etch to expose the upper surface of silicon nitride film 6. Thus, the upper surfaces of silicon nitride film 6 and element isolation insulating film 4 are adjusted so as to be substantially at level.

Figure 12:
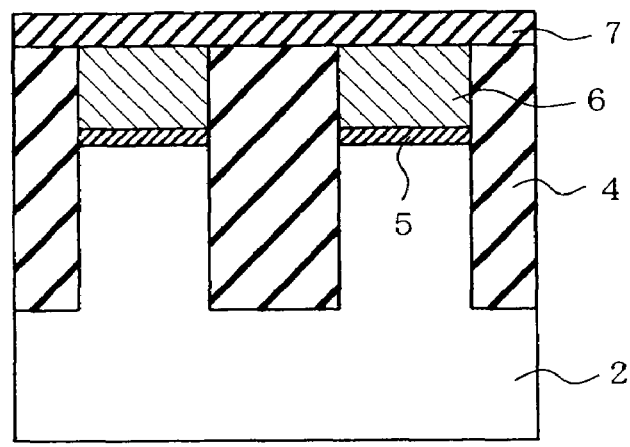

Next, referring to FIG. 12, a barrier layer 7 is formed on the exposed upper surface of silicon nitride film 6 and the upper surface of element isolation insulating film 4. Barrier layer 7 is formed by ALD (Atomic Layer Deposition) in which dichlorosilane ($SiH_2Cl_2$) gas and ammonia ($NH_3$) gas are alternately supplied at the temperature of 600 degrees Celsius or less.

ALD is employed because it yields conformal film thickness. Since ammonium gas used for nitridation includes hydrogen atom, radical nitridation may be employed in forming barrier layer 7. Since radical nitridation does not require the use of ammonia gas, hydrogen atom contained in ammonia gas will not be introduced into active area Sa of memory cell transistor Trm and thus, no fixed charge develops in active area Sa. By preventing development of fixed charge, reduction of threshold voltage can be prevented to improve device properties. To summarize, use of gas not containing hydrogen provides the above mentioned advantages. By configuring barrier layer 7 to proximate the composition of $Si_3N_4$ to the possible extent, transfer of electrodes between the neighboring gate electrodes MG through barrier layer 7 can be prevented.

Silicon nitride film 6, on the other hand, yields advantageous effects if configured more silicon rich in stoichiometrical amount as compared to the composition of barrier layer 7 ($Si_3N_4$, for example). This is due to the increased amount of electrode capturing (storing) taking place when configured in such composition. The composition of barrier layer 7 may vary from $Si_3N_4$ if it includes silicon and nitrogen atoms.

Barrier layer 7 may be thermally treated after its formation to increase its density and to obtain the ideal chemical bond. Thermal treatment also allows unwanted elements to be eliminated. Thermal treatment in such case is carried out at a temperature greater than the temperature in which barrier layer 7 is formed. Thermal treatment may be carried out under inert or oxidative atmosphere. Thermal treatment under inert atmosphere yields higher density and ideal chemical bond. Thermal treatment under oxidative atmosphere, for example, such as ($H_2O$ atmosphere) yields reduction in unwanted substance such as hydrogen, whereas $O_2$ and $O_3$ atmosphere, for example, yields reduction in unwanted materials such as carbon. Thermal treatment may be carried out to control the amount of nitrogen and to compensate for lack of nitrogen in order to form a barrier layer 7 comprising nitride.

Figure 13:
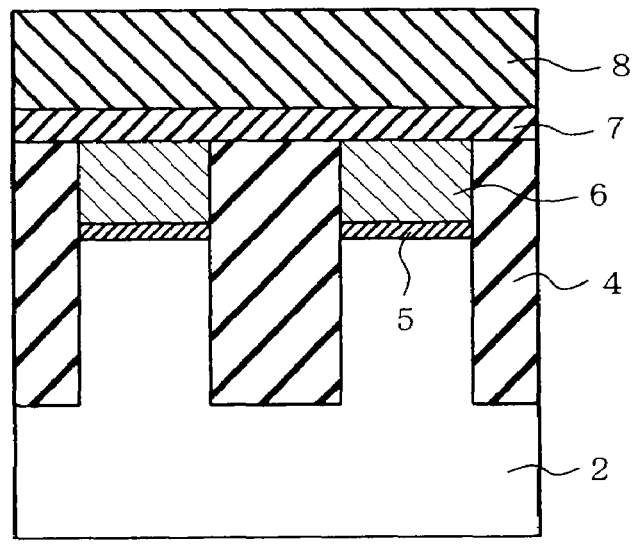

Next, as shown in FIG. 13, a block film 8 comprising a metal oxide such as alumina $Al_2O_3$ is formed on the upper surface of barrier layer 7. Block film 8 comprising alumina may be formed by the reaction of trimethylaluminum (($CH_3$)Al) and an oxidative agent (such as $O_2$, $O_3$, $H_2O$) at 600 degrees Celsius or less being alternately introduced into the furnace by LP-CVD.

Thereafter, metal oxide layer comprising block film 8 is annealed as required for densification and removing unwanted substances such as carbon and nitride, and then oxidated as required to compensate oxygen loss. Such enhancement measures do indeed provide device property improvement when performed at or greater than the temperature in which block film 8 is formed, but is further advantageous if carried out at or greater than a predetermined temperature for temperature densification or at or greater than crystallization temperature which are more higher in temperature. Such temperature may be variably adjusted depending on the composition of block film 8, where in case of alumina, the temperature may be set at 1000 degrees Celsius or greater, and in case of hafnia ($HfO_2$) equal to or greater than 800 degrees Celsius. Densification of block film 8 allows increase in relative dielectric constant, barrier height, and tolerability to the etchant, and reduces possibility of discharging of impurity within block film 8. Densification of block film 8 further renders block film 8 less affected by damaging originating from thermal treatment and the atmosphere in the back end process.

Even when enhancement measures are taken on block film 8, since barrier layer 7 is formed immediately below block film 8 so as to cover the underside of block film 8, oxygen atom (O) causing property deterioration (such as development of a bird's beak) of tunnel insulating film 5 can be prevented from being introduced into tunnel insulating film 5 and active area Sa of silicon substrate 2 through element isolation insulating film 4. Thus, sufficient tunnel current can be secured to obtain an effective channel region or a utility tunnel region that yields sufficient write/erase speed, thereby improving the overall device property.

Next, as can be seen in FIG. 3, a silicon layer doped with impurities such as phosphorus is deposited by CVD on the upper surface of block film 8 to constitute a polygate. The silicon layer is formed by LP-CVD by introducing silane (SiCH$_4$) and phosphine (PH$_3$) into the furnace at approximately 500 degrees Celsius. Then as shown in FIG. 4, control gate electrode CG, block film 8, barrier layer 7, and silicon nitride film 6 are isolated in the Y-direction by anisotropic etching to form a plurality of gate electrodes MG. Thereafter, impurities are introduced into the surface layer of silicon substrate 2 by ion implantation at both sides of gate electrode MG to form source/drain region 2a. Then, insulating film is formed between gate electrodes MG and interconnecting comprising formation of bit line contact, source line contact, and upper layer interconnect (such as bit line BL) is carried out but will not be described in detail since such steps have no direct contribution to the features of the present exemplary embodiment.

According to the present exemplary embodiment, each of element isolation films 4 filled in trenches 3 contains oxide material and is configured to protrude upward such that its upper portion 4a protrudes from the upper surface of silicon substrate 2. On active areas Sa situated between upper portions 4a of element isolation insulating film 4, a tunnel insulating film 5 and a nitride film (charge trap layer) 6 are laminated in listed sequence. Barrier layer 7 and block film 8 are formed across the upper surface of element isolation insulating film 4 and the upper surface of silicon nitride film 6 and a control gate electrode CG is formed further on the upper surface of block film 8. Barrier layer 7 including a nitride and being placed between element isolation insulating film 4 and block film 8 minimizes the risk of unwanted elements such as carbon and oxygen from passing through block film 8 and adversely affecting the underlying features such as silicon substrate 2 and tunnel insulating film 5 to improve device properties.

Since silicon nitride film 6 is configured silicon rich in stoichiometrical amount as compared to the nitride film configuring barrier layer 7, amount of charge trapped in silicon nitride film 6 can be increased.

When the silicon nitride film configuring barrier layer 7 has a composition of Si$_3$N$_4$, transfer of electrons between the gate electrodes MG of the neighboring memory cells through barrier layer 7 can be prevented.

Barrier layer 7, being formed by ALD (Atomic Layer Deposition), provides greater conformity in film thickness. Alternatively, when barrier layer 7 is formed by radical nitridation, the nitride film configuring barrier layer 7 can be formed in a hydrogen-free environment, thus eliminating the negative impact of hydrogen. By thermally treating block film 8 in an oxidative atmosphere at a temperature equal to or greater than the temperature at which block film 8 was formed, the process results in reduced amount of unwanted elements such as hydrogen and carbon.

Figure 14:
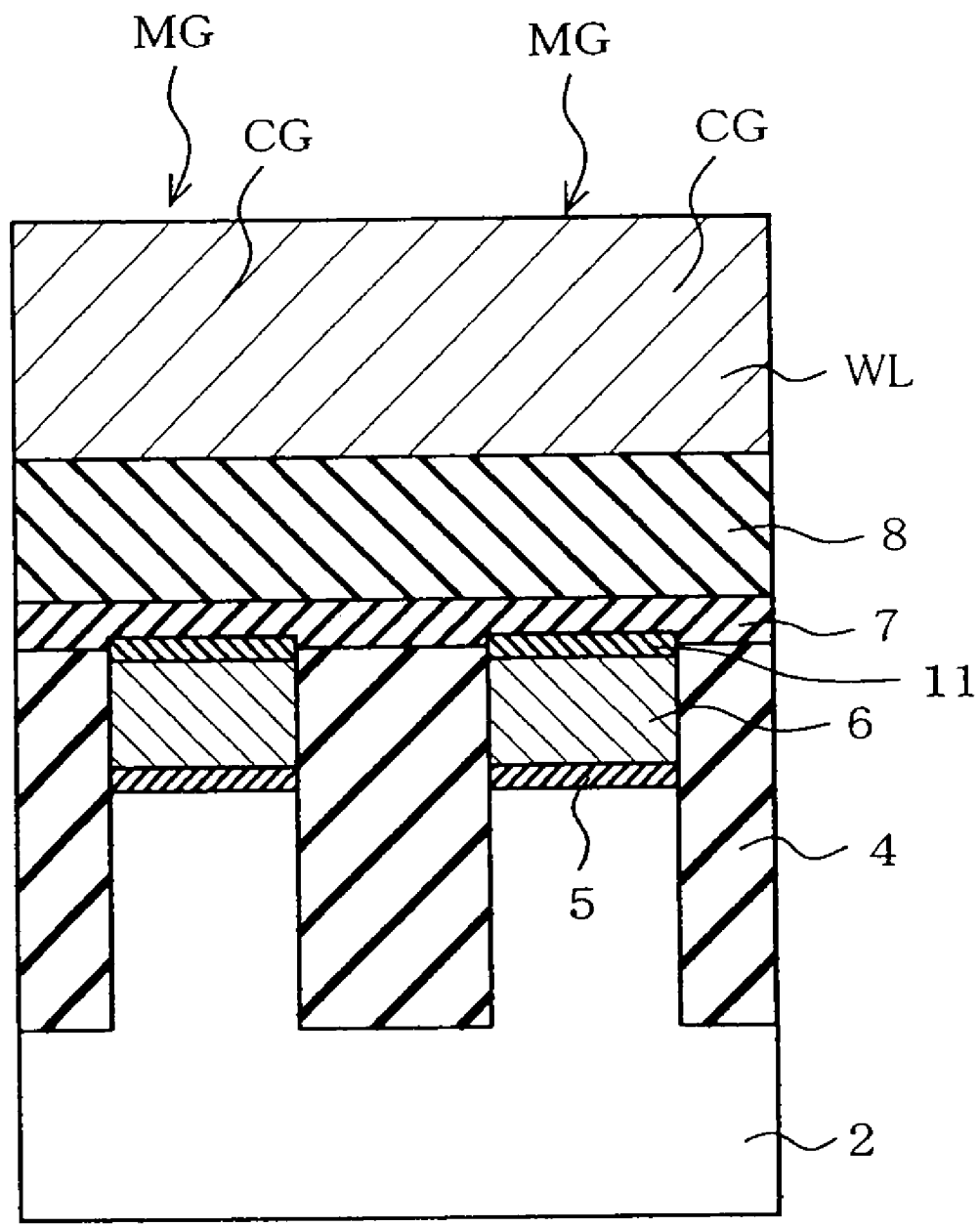
FIG. 14 corresponds to FIG. 3 and indicates a second exemplary embodiment of the present disclosure.

FIG. 14 depicts a second exemplary embodiment of the present disclosure. The second exemplary embodiment differs from the first exemplary embodiment in that an oxide film is formed directly on the charge storing layer. Portions that are identical to the first exemplary embodiment are identified with identical reference symbols and will not be re-described. Description will be given only on portions that differ.

In the present exemplary embodiment, an oxide film 11 is formed on the upper surface of silicon nitride film 6 so as to be disposed between silicon nitride film 6 and barrier layer 7 to facilitate leak current suppression. Oxide film 11 is formed after exposing the upper surface of silicon nitride film 6 and before forming barrier layer 7. Oxide film 11 is formed, for example, by supplying a radical oxide to the upper surface of the silicon nitride film 6. Oxide film 11 may comprise a chemical oxide film formed by chemical treatment or a native oxide film naturally occurring as a result of exposing the upper surface of silicon nitride film 6.

Oxide film 11, being configured as described above, serves as a charge energy barrier between the nitride film configuring barrier layer 7 and silicon nitride film 6. As a result, transfer (discharge) of electrons from silicon nitride film 6 to the neighboring memory cells through barrier layer 7 can be minimized. It has been verified by the inventors that minimization of electron transfer is effectuated when oxygen density at the interface is around $10^{19}$ [atoms/cm$^3$] or greater.

According to the second exemplary embodiment described above, oxide film 11 is formed between silicon nitride film 6 and barrier layer 7 and thus, barrier height at the interface of silicon nitride film 6 comprising charge trap layer and nitride film configuring barrier layer 7 can be increased. Such configuration prevents transfer of electrodes trapped in silicon nitride film 6 to the neighboring cell or control gate electrode CG during voltage application in a write operation, for example.

FIGS. 15A to 17 depict a third exemplary embodiment of the present disclosure. The third exemplary embodiment of the present disclosure differs from the first and second exemplary embodiments in that an oxide film is formed between the element isolation insulating film 4 and barrier layer 7. Portions that are identical to the first exemplary embodiment are identified with identical reference symbols and will not be re-described. Description will be given only on portions that differ.

Figure 15A:
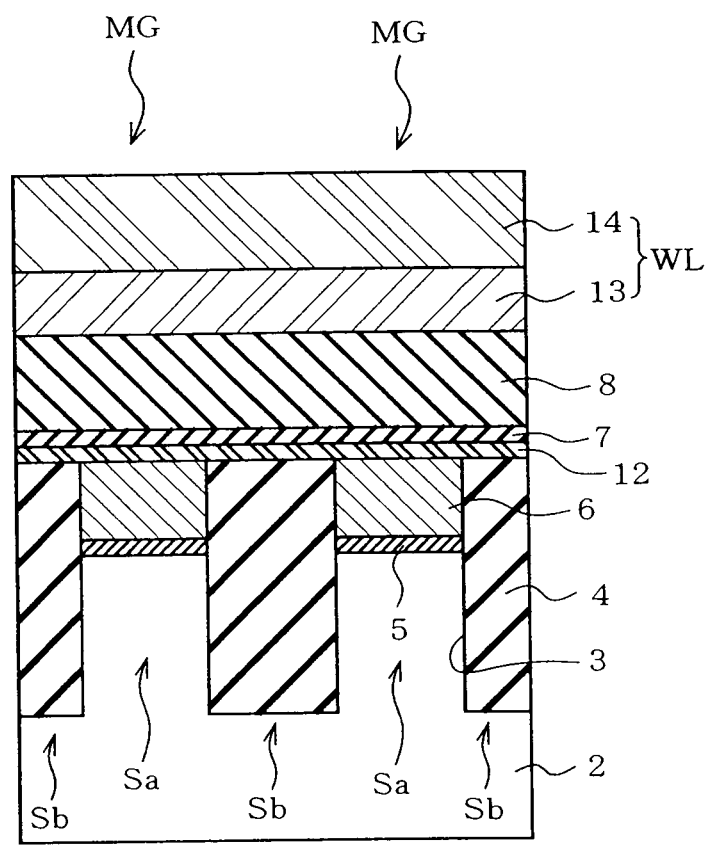
FIG. 15A corresponds to FIG. 3 and indicates a third exemplary embodiment of the present disclosure.
Figure 15B:
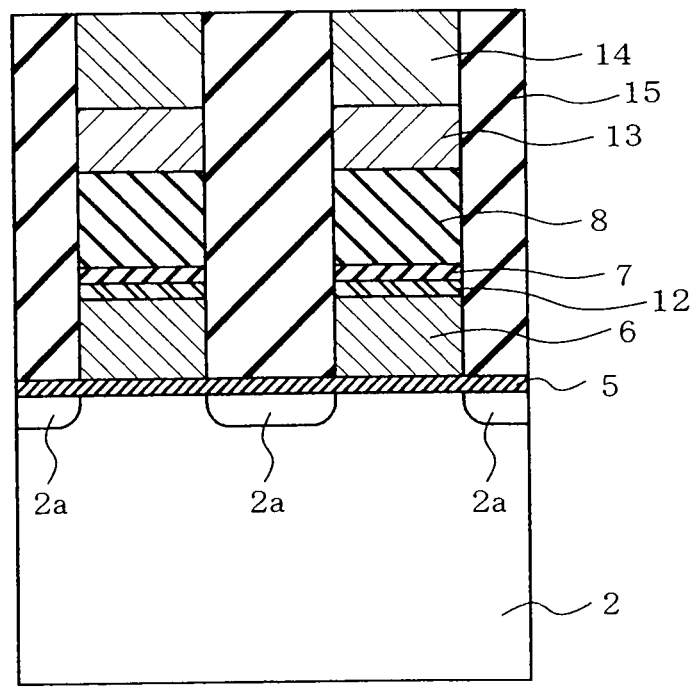
FIG. 15B corresponds to FIG. 4.

FIG. 15A is a schematic vertical cross-sectional view corresponding to FIG. 3 and FIG. 15B is a schematic vertical cross-sectional view corresponding to FIG. 4.

As can be seen in FIGS. 15A and 15B, silicon oxide film 12 is formed immediately below barrier layer 7 so as to be disposed between barrier layer 7 and silicon nitride film 6 and between barrier layer 7 and element isolation insulating film 4. Silicon oxide film 12 is formed continuously on the upper surface of element isolation insulating film 4 and the upper surface of silicon nitride film 6 such that the upper surface of silicon oxide film 12 defines a coplanar surface above element isolation insulating film 4 and silicon nitride film 6. Silicon oxide film 12 has less charge (electron) trap compared to silicon nitride film, for example. Silicon oxide film 12 may be replaced by silicon oxynitride film.

When silicon oxide film 12 is formed continuously on the upper surface of silicon nitride film 6 and the upper surface of element isolation insulating film 4, leak of charge trapped in silicon nitride film 6 to neighboring memory cell gate electrodes MG via barrier layer 7 can be prevented to maintain fair charge trap property of silicon nitride film 6 and minimizing shift in threshold voltage.

Silicon oxide film 12 is formed thinner than block film 8, which means that silicon oxide film 12 is formed in relatively shorter time period and thus, reducing the impact of oxidative agent on tunnel insulating film 5.

On the upper surface of silicon oxide film 12, barrier layer 7 is formed having a coplanar upper surface situated above silicon nitride film 6 and element isolation insulating film 4. Barrier layer 7, as described earlier, does not allow unwanted elements such as an oxygen atom (O) to pass through it. Thus, even if oxide material constituting block film 8 is formed thick and thermally treated at high temperature in an oxidative atmosphere, negative impact of oxidative material on elements such as active area Sa of silicon substrate 2 and on tunnel insulating film 5 can be minimized. The above described configuration provides effective and practical channel region or tunnel region which in turn provides sufficient tunnel current and thus, sufficient write/erase speed.

Figure 16:
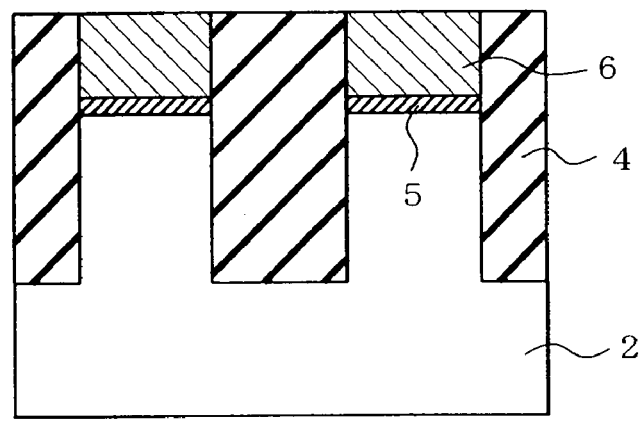
FIG. 16 corresponds to FIG. 11.
Figure 17:
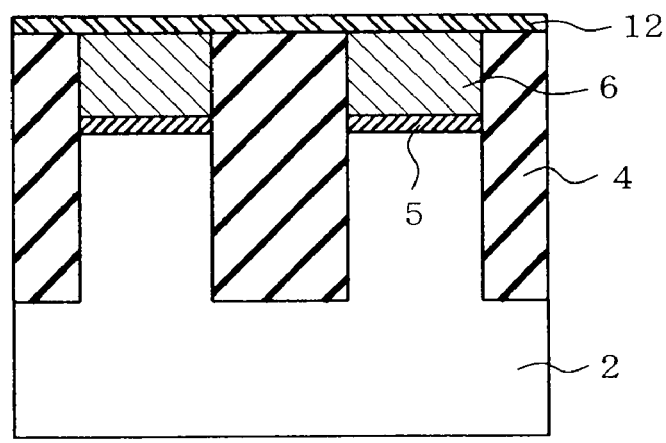
FIGS. 17 and 18 are descriptive views of manufacturing phases subsequent to FIG. 16.

A description on a manufacturing method of the above described configuration will be given hereinafter with reference to FIGS. 16 to 18. FIG. 16 corresponds to FIG. 11 and is shown for depicting one phase of the manufacturing method. As shown in FIG. 17, silicon oxide film 12 is lined on the upper surface of silicon nitride film 6 and element isolation insulating film 4. Silicon oxide film 12 is formed by LP-CVD (Low Pressure-Chemical Vapor Deposition) at a temperature of 550 degrees Celsius, using tris (dimethylamino) silane ($SiH(N(CH_2)_2)_3$: TDMAS) as silicon source and ozone ($O_3$) as oxidative agent. Repeated adsorption and oxidation of the silicon source results in the deposition of silicon oxide film 12. Silicon oxide film 12 is formed at a predetermined thickness of approximately 2 [nm].

Figure 18:
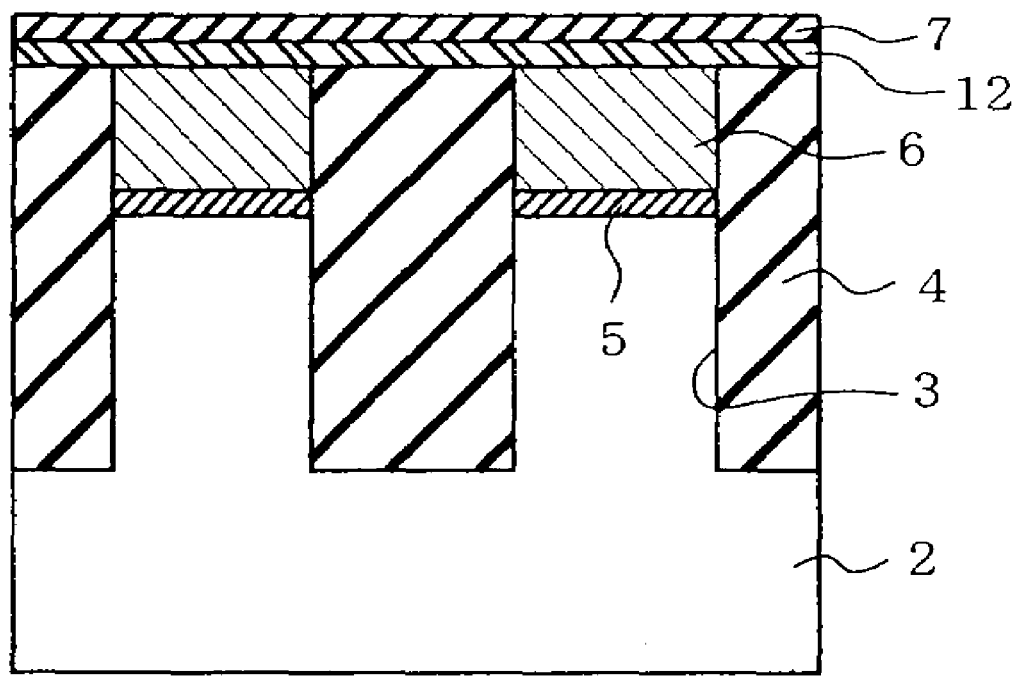

Then, as shown in FIG. 18, barrier layer 7 comprising a silicon nitride film is formed on the upper surface of silicon oxide film 12. In the present exemplary embodiment, nitride excited in high-frequency is formed into a silicon nitride film serving as a barrier layer 7 at approximately 500 degrees Celsius or lower. More specifically, silicon nitride film is formed using nitrogen ($N_2$) gas as nitrogen source, argon (Ar) as excitation gas under a pressure of approximately 1 [Torr] or less and at excitation power of 1 [kW] or greater.

By forming barrier layer 7 as described above, silicon oxide film 12 can be thinned to 1 [nm]. By forming a silicon oxide film 12 having a relatively high barrier height and a relatively less charge trap between barrier layer 7 and element isolation insulating film 4, no contact can be established between barrier layer 7 and silicon nitride film 6, thus, preventing charge trapped in silicon nitride film 6 from being discharged into neighboring memory cells through barrier layer 7.

Tris (dimethylamino) silane (TDMAS) used as silicon source in the present exemplary embodiment may be replaced by organic metal containing ($SiH_2[NH(C_4H_9)]_2$, bis(tertiary-butyl-amino) silane: BTBAS), halogenated silicon such as (Hexa chloro disilane: $Si_2Cl_6$)), and the like, which also allow formation of silicon oxide film 12 under relatively low temperature (600 degrees Celsius or lower).

If there is a possibility of bird's beak being developed at the ends of tunnel insulating film 5, silicon oxide film 12 may be formed under a less-oxidative condition. Especially when sensitive control of film thickness is required, ALD (Atomic Layer Deposition) may be employed.

If there is a small possibility of development of bird's beak, LP-CVD may be employed to form silicon oxide film 12 using, for example, silane ($SiH_4$) or dichlorosilane ($SiH_2Cl_2$: DCS) and nitrous oxide ($N_2O$) at a predetermined temperature in the range of approximately 600 degrees Celsius to 800 degrees Celsius. A silicon oxynitride film may be formed instead of silicon oxide film 12.

Silicon nitride film that serves as barrier layer 7 may be formed by LP-CVD using silicides such as silane, dichlorosilane, and hexachlorodislane, or other materials such as Tris (dimethylamino) silane and bis (tertiary-butyl-amino) silane as silicon source. As source of nitridation, ammonia gas or physically excited ammonia may be used. Combination of sources described above allows formation of silicon nitride film under a temperature range of approximately 450 to 800 degrees Celsius.

Among the above described combinations, one effective combination may be forming silicon oxide film 12 by ALD with Tris (dimethylamino) silane and ozone, and forming silicon nitride film serving as barrier layer 7 by ALD with dichlorosilane and physically excited ammonia.

The laminated films 12, 7 and 8 may be formed consecutively without being exposed to the atmosphere. The laminated films 12, 7, and 8, when exposed to the atmosphere, may adsorb substances such as carbon compound and sulfur compound on their surfaces to cause interface contamination and deteriorate device properties and moreover, is disadvantageous in productivity. The manufacturing steps that follow will not be described because they are the same as the previous exemplary embodiment.

In the third exemplary embodiment, silicon oxide film 12 is formed between silicon nitride film 6 and barrier layer 7 and between barrier layer 7 and element isolation insulating film 4. Such configuration prevents charge transfer between neighboring memory cell gate electrodes MG.

Since silicon oxide film 12 is formed thinner than block film 8, the effect of oxidative agent, used in forming silicon oxide film 12, on tunnel insulating film 5 and active area Sa can be minimized.

The present disclosure is not limited to the above described exemplary embodiments but may be modified or expanded as follows.

The features of the present disclosure may be applied to any other nonvolatile semiconductor storage other than NAND flash memory 1 as long as they are configured such that multiplicity of memory cell transistors are aligned in the bit line and the word line directions.

Barrier layer 7 being configured by silicon nitride film ($Si_3N_4$) may be replaced by other silicon nitride films having different composition ratios, a single layered film such as silicon oxynitride film (SiON) and aluminum nitride (AlN) or combination of these films, laminated layers of silicon oxide film ($SiO_2$) and various film configuration containing a nitride film.

Barrier layer 7 being formed by ALD or radical nitridation may be formed by LP-CVD which is commonly employed. Alternatively, a silicon oxynitride film may be formed by forming a silicon oxide film and nitridating the silicon oxide film by radical nitridation.

Control gate CG and word line WL may comprise a silicon layer doped with impurity; a silicide layer in which the upper portion of silicon layer (polygate) is silicided with metal such as tungsten (W), nickel (Ni), and cobalt (Co); a metal layer such as tantalum nitride, (TaN) and tungsten (W), or combination of the aforementioned features.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:
1. A semiconductor storage device, comprising:
a semiconductor substrate including an upper surface having a plurality of trenches formed into the upper surface;
a plurality of element isolation insulating films filled in each of the trenches so as to protrude upward from the upper surface of the semiconductor substrate, the element isolation insulating films containing an oxide material;
a tunnel insulating film formed on the semiconductor substrate situated between the trenches filled with the element isolation insulating films and below a top level of the element isolation insulating films;

a charge storing layer comprising a first nitride film and being formed on the tunnel insulating film;

a block film formed across an upper surface of the charge storing layer and an upper surface of the element isolation insulating film to prevent charge transfer;

a gate electrode formed on the block film; and a barrier layer containing a second nitride film formed between the element isolation insulating film and the block film, wherein the first nitride film and the second nitride film each comprises a silicon nitride, the first nitride film being silicon rich in stoichiometrical amount compared to the second nitride film.

2. The device according to claim 1, wherein the second nitride film is formed continuously across the upper surface of the charge storing layer and the upper surface of the element isolation insulating films.

3. The device according to claim 2, wherein an oxide film is formed between the charge storing layer and the barrier layer.

4. The device according to claim 3, wherein the oxide film is formed between the element isolation insulating film and the barrier layer.

5. The device according to claim 4, wherein the oxide film is formed thinner than the block film.

6. The device according to claim 1, wherein the second nitride film comprises a silicon nitride film ($Si_3N_4$).

7. The device according to claim 1, wherein the block film comprises a metal oxide.

8. The device according to claim 7, wherein the block film comprises alumina.

9. A method of manufacturing a semiconductor storage device, comprising:

forming a tunnel insulating film on a semiconductor substrate;

forming a charge storing layer comprising a first nitride film on the tunnel insulating film;

forming a plurality of trenches into the charge storing layer, the tunnel insulating film, and an upper portion of the semiconductor substrate, the trenches formed so that the tunnel insulating film is situated between the trenches and a top level of the tunnel insulating film is below a top level of the trenches;

forming an element insulating film in each of the trenches;

forming a barrier film containing a second nitride film across an upper surface of the charge storing layer and an upper surface of the element isolation insulating film;

forming a block film on the barrier layer to prevent charge transfer of charge stored in the charge storing layer; and forming a gate electrode on the block film, wherein the first nitride film and the second nitride film each comprises a silicon nitride, the first nitride film being silicon rich in stoichiometrical amount compared to the second nitride film.

10. The method according to claim 9, wherein the barrier layer is formed by atomic layer deposition.

11. The method according to claim 9, wherein the second nitride film is formed by radical nitridation.

12. The method according to claim 9, wherein the block film comprises a metal oxide film containing aluminum.

13. The method according to claim 9, further comprising thermally treating the block film under an oxidative atmosphere at a temperature equal to or greater than a temperature at which the block film is formed.

14. The method according to 9, further comprising forming an oxide film on the charge storing layer prior to forming the second nitride film.

15. The method according to claim 14, wherein the oxide film is formed selectively on an upper surface of the charge storing layer and not on an upper surface of the element isolation insulating film.

16. The method according to claim 14, wherein the oxide film is formed on the upper surface of the element isolation insulating film as well so as to be situated between the block film and the element isolation insulating film.

17. The method according to claim 16, wherein the oxide film is formed by atomic layer deposition.

18. The method according to claim 16, wherein the oxide film is formed thinner than the block film.

* * * * *